United States Patent
Sandhu et al.

(10) Patent No.: US 7,557,006 B2
(45) Date of Patent: *Jul. 7, 2009

(54) METHODS OF FORMING FIELD EFFECT TRANSISTORS

(75) Inventors: Gurtej S. Sandhu, Boise, ID (US); H. Montgomery Manning, Eagle, ID (US); Cem Basceri, Reston, VA (US)

(73) Assignee: Micron Technology, Inc., Boise, ID (US)

( * ) Notice: Subject to any disclaimer, the term of this patent is extended or adjusted under 35 U.S.C. 154(b) by 441 days.

This patent is subject to a terminal disclaimer.

(21) Appl. No.: 11/490,681

(22) Filed: Jul. 21, 2006

(65) Prior Publication Data

US 2006/0258071 A1  Nov. 16, 2006

Related U.S. Application Data (63) Continuation of application No. 10/925,100, filed on Aug. 23, 2004, now Pat. No. 7,262,099.

(51) Int. Cl.
*H01L 21/336* (2006.01)

(52) U.S. Cl. ................... 438/268; 438/300; 257/329; 257/E21.41

(58) Field of Classification Search ............ 438/268, 438/300; 257/329, 300, E21.41
See application file for complete search history.

(56) References Cited

U.S. PATENT DOCUMENTS

| | | | |
|---|---|---|---|
| 5,780,343 A | 7/1998 | Bashir | |
| 6,297,531 B2 * | 10/2001 | Armacost et al. | 257/329 |
| 6,387,758 B1 * | 5/2002 | Yu et al. | 438/269 |
| 6,624,032 B2 * | 9/2003 | Alavi et al. | 438/283 |
| 6,756,273 B2 * | 6/2004 | Hadizad et al. | 438/269 |
| 6,969,644 B1 | 11/2005 | Visokay et al. | |
| 2003/0122187 A1 | 7/2003 | Yoo | |
| 2006/0268071 A1 | 11/2006 | Sandhu et al. | |

* cited by examiner

*Primary Examiner*—Douglas M Menz
*Assistant Examiner*—Steven J Fulk
(74) *Attorney, Agent, or Firm*—Wells St. John P.S.

(57) ABSTRACT

A mass of material is formed over a semiconductor substrate. Semiconductive material is formed laterally proximate the mass of material. A space is provided laterally between the mass of material and the semiconductive material. The space comprises an outermost portion and a portion immediately adjacent thereto. The outermost portion has a maximum lateral width which is greater than that of the adjacent portion. Gate dielectric material and conductive gate material are formed within the space. The gate dielectric material and the conductive gate material in combination fill the adjacent portion of the space but do not fill the outermost portion of the space. At least the conductive gate material is etched from at least a majority of the outermost portion of the space. Source/drain regions are formed operatively proximate the conductive gate material and the semiconductive material is used as a channel region of the field effect transistor.

25 Claims, 9 Drawing Sheets

_Fig. 1_

_Fig. 2_

METHODS OF FORMING FIELD EFFECT TRANSISTORS

RELATED PATENT DATA

This patent resulted from a continuation application of U.S. patent application Ser. No. 10/925,100, filed Aug. 23, 2004 now U.S. Pat. No. 7,262,099, entitled "Methods of Forming Field Effect Transistors", naming Gurtej S. Sandhu, H. Montgomery Manning and Cern Basceri as inventors, the disclosure of which is incorporated by reference.

TECHNICAL FIELD

This invention relates to methods of forming field effect transistors.

BACKGROUND OF THE INVENTION

A continuing goal in integrated circuitry design is to make ever denser, and therefore smaller, circuit devices. This results in thinner layers and smaller geometries. Further, new deposition techniques and materials are constantly being developed to enable circuit devices to be made smaller than the previous generations. Additionally, circuit designs sometimes fabricate the devices to be substantially horizontally oriented relative to the underlying substrate, and sometimes substantially vertically oriented.

One common circuitry device is a field effect transistor. Such includes a pair of conductive source/drain regions having a semiconductive channel region received therebetween. A conductive gate is received proximate the channel region, with a gate dielectric layer being received between the gate and the channel region. Application of a suitable voltage potential to the gate enables current to flow between the source/drain regions through the channel region, with the transistor being capable of essentially functioning as a switch. This invention was motivated with respect to issues associated with fabricating field effect transistors.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention comprises methods of forming field effect transistors. In one implementation, a mass of material is formed over a semiconductor substrate. Semiconductive material is formed laterally proximate the mass of material. A space is provided laterally between the mass of material and the semiconductive material. The space comprises an outermost portion and a portion immediately adjacent thereto. The outermost portion has a maximum lateral width which is greater than that of the adjacent portion. Gate dielectric material and conductive gate material are formed within the space. The gate dielectric material and the conductive gate material in combination fill the adjacent portion of the space but do not fill the outermost portion of the space. At least the conductive gate material is etched from at least a majority of the outermost portion of the space. Source/drain regions are formed operatively proximate the conductive gate material and the semiconductive material is used as a channel region of the field effect transistor.

In one implementation, a method of forming a field effect transistor includes forming an insulative layer over a semiconductor substrate. The insulative layer comprises an opening therein. Semiconductive material is formed within the opening and laterally spaced from the insulative layer within the opening. The semiconductive material is provided to have faceted outermost corner regions spaced from the insulative layer. Conductive gate material is formed over the faceted corner regions. Conductive gate material is etched from over at least a majority of the faceted corner regions. Source/drain regions are formed operatively proximate the conductive gate material and the semiconductive material is used as a channel region of the field effect transistor.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
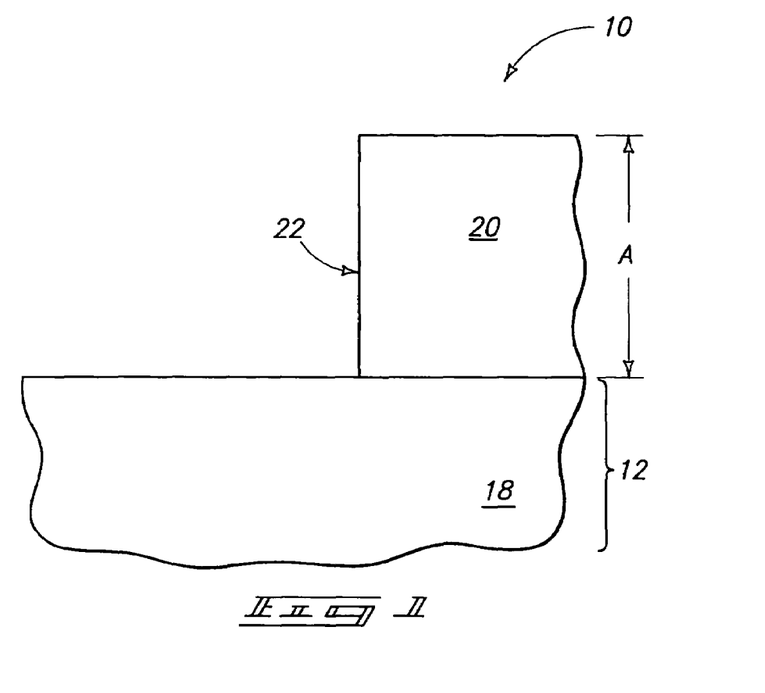
FIG. 1 is a diagrammatic sectional view of a substrate fragment in process in accordance with an aspect of the invention.

An exemplary embodiment of a method of forming a field effect transistor is initially described with reference to FIGS. 1-8. FIG. 1 depicts a substrate fragment 10 comprising a semiconductor substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural unless otherwise indicated. By way of example only, semiconductor substrate 12 comprises a bulk monocrystalline silicon material 18, but of course could comprise semiconductor-on-insulator or other construction.

A mass of material 20 is formed over semiconductor substrate 12. Mass of material 20 has a thickness "A" over semiconductor substrate 12. In one preferred embodiment, mass 20 has a space-defining edge 22, with at least that portion of mass 20 received over semiconductor substrate 12 which is adjacent to space-defining edge 22 being electrically insulative. By way of example only, one example material for mass 20 is doped silicon dioxide, such as borophosphosilicate glass (BPSG). In one preferred embodiment, at least a majority of mass 20 received over semiconductor substrate 12 will remain as part of finished circuitry construction encompassing the field effect transistor being fabricated. In one preferred embodiment, mass 20 comprises one or more insulative layers formed over semiconductor substrate 12.

Figure 2:
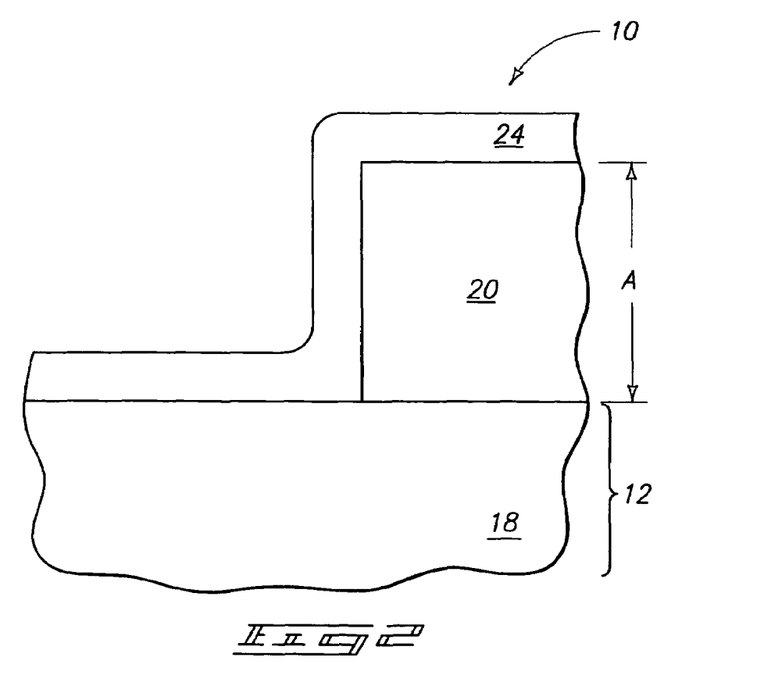
FIG. 2 is a view of the FIG. 1 substrate fragment at a processing step subsequent to that depicted by FIG. 1.

In one preferred embodiment, semiconductive material is formed laterally proximate the mass of material, with a space being provided laterally between the mass of material and the semiconductive material. In such embodiment, the space comprises an outermost portion and a portion immediately adjacent thereto. The outermost portion has a maximum lateral width which is greater than that of the adjacent portion. By way of example only, an exemplary preferred method of forming such semiconductive material and space is described with reference to FIGS. 2-6. Referring to FIG. 2, a sacrificial layer 24 has been deposited over semiconductor substrate 20/12. Such material is preferably highly selectively etchable relative to materials 20 and 18. By way of example only, an exemplary material is silicon nitride where material 18 comprises monocrystalline silicon and material 20 predominately comprises BPSG.

Figure 3:
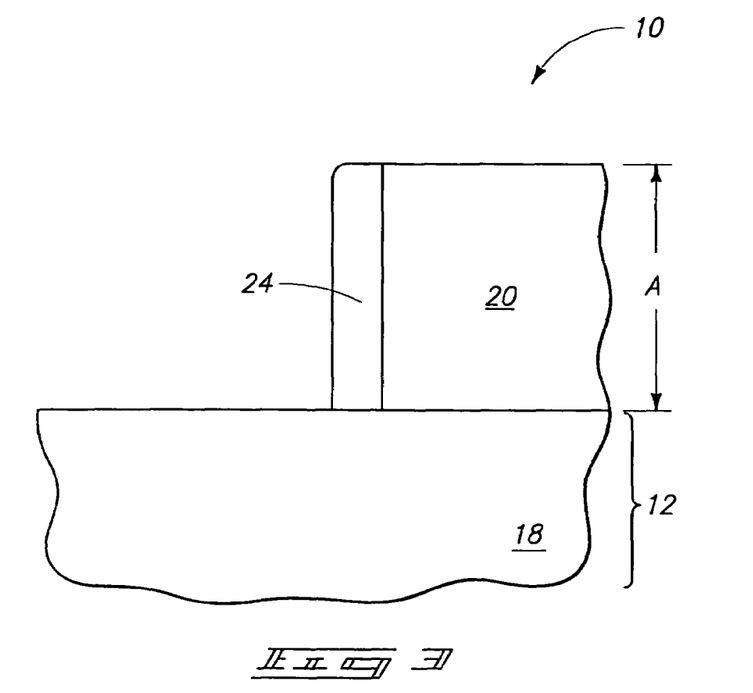
FIG. 3 is a view of the FIG. 2 substrate fragment at a processing step subsequent to that depicted by FIG. 2.

Referring to FIG. 3, sacrificial layer 24 has been anisotropically etched, thereby forming the illustrated spacer of material 24.

Figure 4:
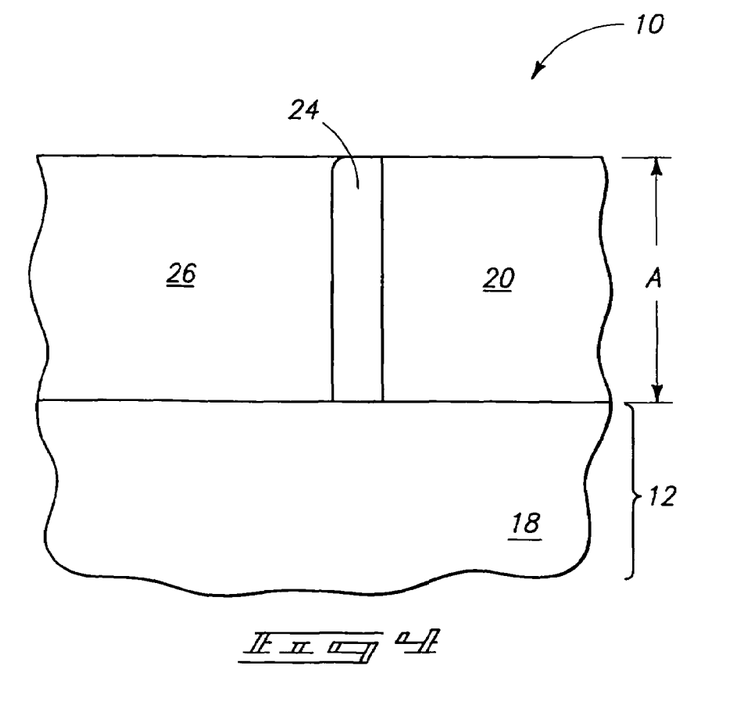
FIG. 4 is a view of the FIG. 3 substrate fragment at a processing step subsequent to that depicted by FIG. 3.

Referring to FIG. 4, semiconductive material 26 has been formed proximate spacer material 24. By way of example only, material 26 might comprise silicon, for example polycrystalline silicon, or a silicon-germanium mixture, or gallium arsenide. Such could be deposited, for example, by chemical vapor deposition followed by chemical mechanical polishing thereof. In one most preferred embodiment, semiconductive material 26 comprises epitaxially-grown silicon, grown from a monocrystalline silicon outer surface of material 18 proximate spacer material 24.

Figure 5:
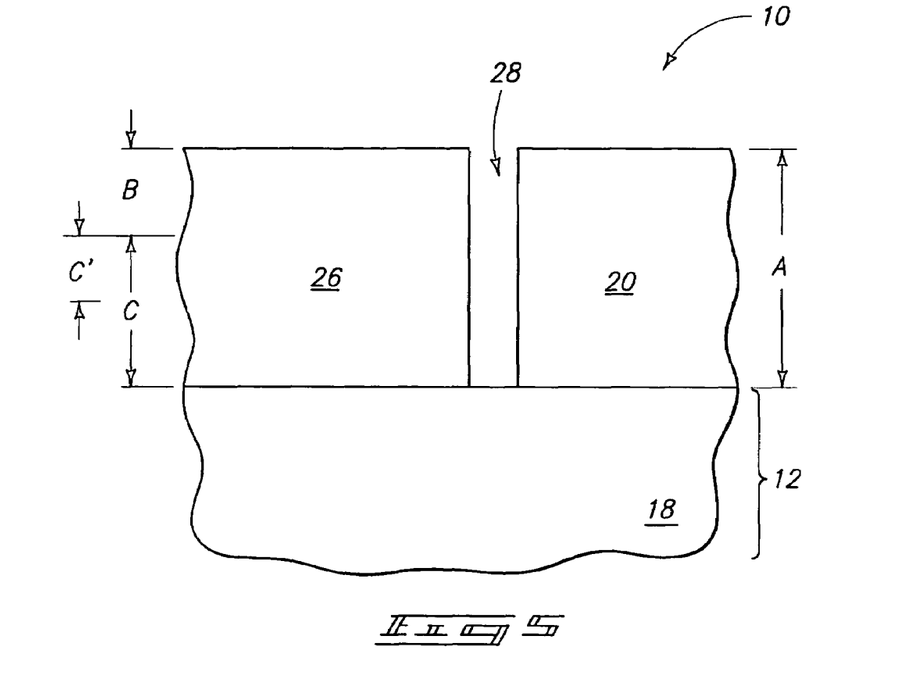
FIG. 5 is a view of the FIG. 4 substrate fragment at a processing step subsequent to that depicted by FIG. 4.
Figure 17:
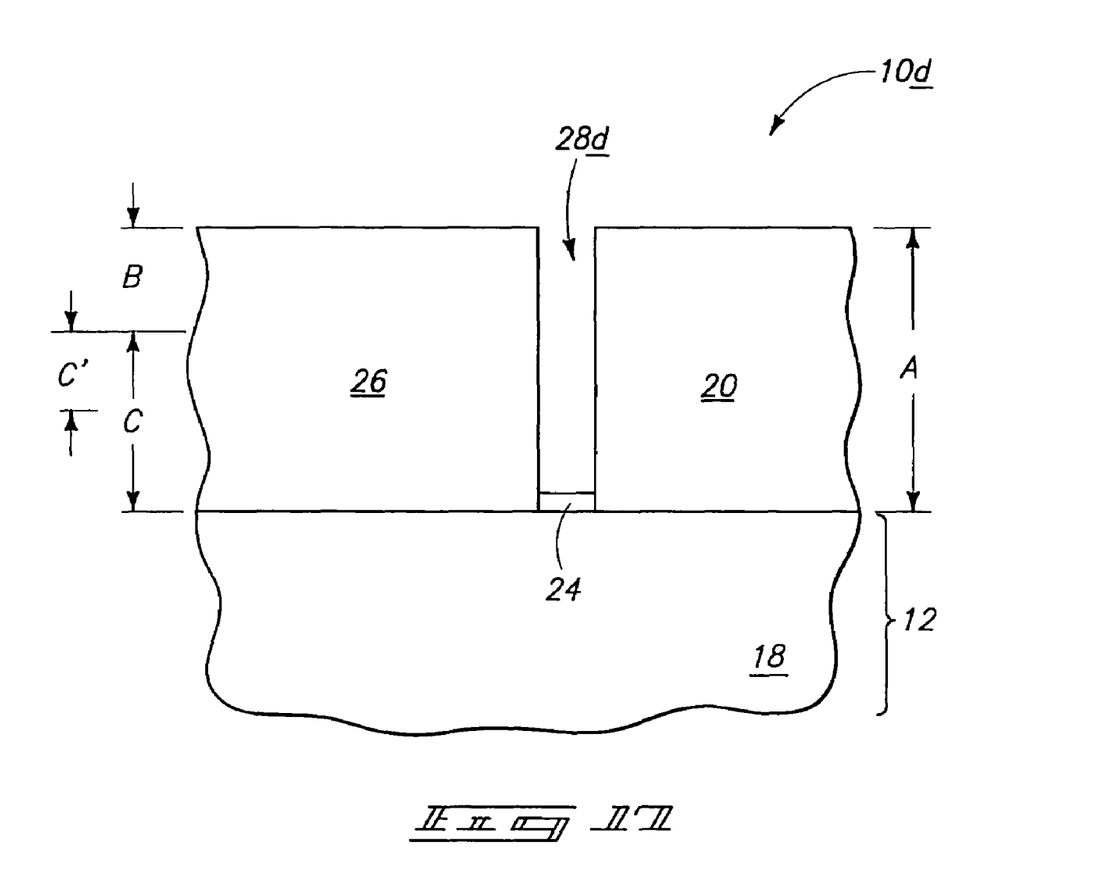
FIG. 17 is an alternate view to that of FIG. 5, showing the FIG. 4 substrate fragment at an alternate processing step subsequent to that depicted by FIG. 4.

Referring to FIG. 5, sacrificial spacer material 24 has been etched from the substrate substantially selectively relative to materials 26, 20 and 18. Any suitable wet or dry chemistry could be utilized, with hot phosphoric acid being an exemplary chemistry for etching silicon nitride selectively relative to silicon and BPSG. Such forms a space 28 laterally between mass of material 20 and semiconductive material 26. Space 28 can be considered as comprising some outermost portion B and a portion C immediately adjacent thereto. By way of example only, adjacent portion C is depicted as extending from outermost portion B to semiconductor substrate 12. However, a portion of space 28 immediately adjacent an outermost portion B only requires consideration of only a portion of the exemplary depicted portion C that is immediately adjacent portion B and not the entirety thereof (i.e., a portion C'). Regardless, in one preferred embodiment, outermost portion B of space 28 has a height of at least 50 Angstroms, and in one preferred embodiment has a height no greater than 400 Angstroms. Further and regardless, in one preferred embodiment, space 28 extends along all of thickness A of mass of material/layer 20 at least at this point in one preferred embodiment of a method in accordance with one aspect of the invention. Alternately of course, such space might not extend along all of such thickness A. By way of example only, such is shown in FIG. 17 where some of material 26 remains in a space 28d on a substrate 10d.

Figure 6:
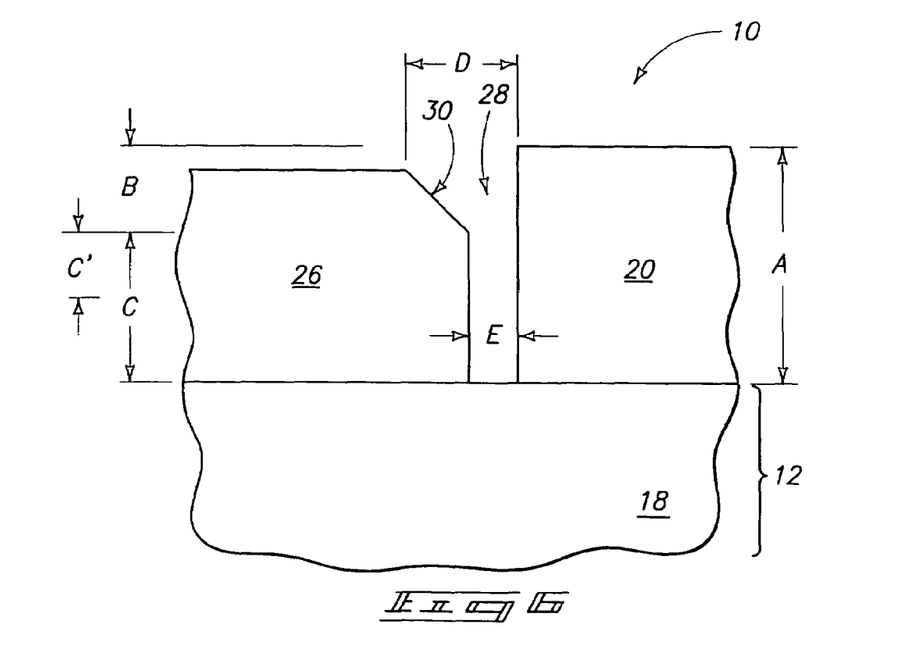
FIG. 6 is a view of the FIG. 5 substrate fragment at a processing step subsequent to that depicted by FIG. 5.

Referring to FIG. 6, outermost portion B of space 28 is provided to have a maximum lateral width D which is greater than that (a maximum lateral width E) of adjacent portion C. One manner of providing such a space 28 might be during the actual formation (not shown in FIGS. 4-5) of semiconductive material 26 without separate etching of it after its formation. Alternately as depicted by the FIGS. 5 and 6 embodiment, widened outermost portion D of space 28 is provided by removing an outermost portion (i.e., the depicted removed corner portion) of semiconductive material 26 after such has been formed (i.e., the formation of such prior to any removing being depicted in FIG. 4).

For example, conditions can be chosen during selective epitaxial deposition which inherently produce a construction having a faceted corner during deposition of the epi. Facet evolution during selective epitaxial silicon deposition is typically determined by interfacet transport caused by atom diffusion from one facet to another, as well as by the relative growth rates of the various crystallographic planes. Thermodynamics impact and can dominate interfacet transport. On monocrystalline silicon, the directions for interfacet transport in epitaxial silicon deposition are generally from the (111) plane to the (311) plane, from the (311) plane to the (100) plane, and from the (111) plane to the (100) plane if the (311) plane disappears. From an energy standpoint, (111) facets are most favorable indicating that any faceting other than (111) results from non-equilibrium conditions. For all but the slowest growth rates, thermodynamics play a minor role compared to growth kinetics. Yet, kinetics are understood to typically dominate faceting. Any faceting is affected by the epitaxial growth rate, with the facets occurring on the slowest growing plane. If facet-free silicon epitaxy with (100) substrates is desired, the growth rate of (100) should be less than that of other planes. Temperature, pressure, and the presence of HCl can impact the relative growth rates on the various planes. In general, reducing temperature, increasing pressure and reducing HCl presence lead to reduced faceting when depositing on (100) monocrystalline silicon. Accordingly, such processing can be utilized to produce substantially facet-free epitaxially grown silicon is desired. Likewise, increasing temperature, reducing pressure and increasing HCl can be utilized to produce the exemplary FIG. 6 depicted faceting during deposition when forming epitaxial monocrystalline silicon on, for example, a (100) silicon substrate.

By way of example only, an exemplary process for forming substantially facet-free deposited epitaxial silicon on Si(100) substrates includes a temperature of 750° C., pressure of 30

Torr, dichlorosilane flow of 0.2 slm, HCl flow at 0.1 slm and $H_2$ flow at 15 slm. Further by way of example only, an exemplary method for depositing faceted epitaxial silicon on Si(100) substrates during deposition, for example to inherently produce the structure of FIG. 6 during deposition, includes a temperature of 800° C., pressure of 10 Torr, dichlorosilane flow of 0.7 slm, HCl flow at 0.1 slm and $H_2$ flow at 15 slm.

Alternately as alluded to above, a method of producing outermost portion B of space 28 to have a maximum lateral width which is greater than that of adjacent portion C is by some removing action of an outermost portion of material 26 after the formation of material 26, and regardless of any degree of faceting which might occur during the deposition of material 26. By way of example only, exemplary methods include masked or maskless angled physical ion bombardment etching, dry etchback, and potassium hydroxide wet etching.

In one preferred embodiment, outermost portion B of space 28 has variable width along its height, for example as depicted in FIG. 6. Regardless, in one preferred embodiment, semiconductive material 26 comprises a planar surface 30 extending along at least some of outermost portion B of space 28, with FIG. 6 depicting one preferred embodiment wherein a planar surface 30 extends along all of outermost portion B of space 28. Of course, and alternately by way of example only, only/just some of such surface might be planar in the depicted cross-section, or perhaps none of such surface be planar in the depicted cross-section.

In one preferred embodiment and as depicted, space 28 has a substantially constant width along mass of material 20 from semiconductor substrate 12 outwardly to outermost portion B, namely all along the depicted portion C.

Figure 7:
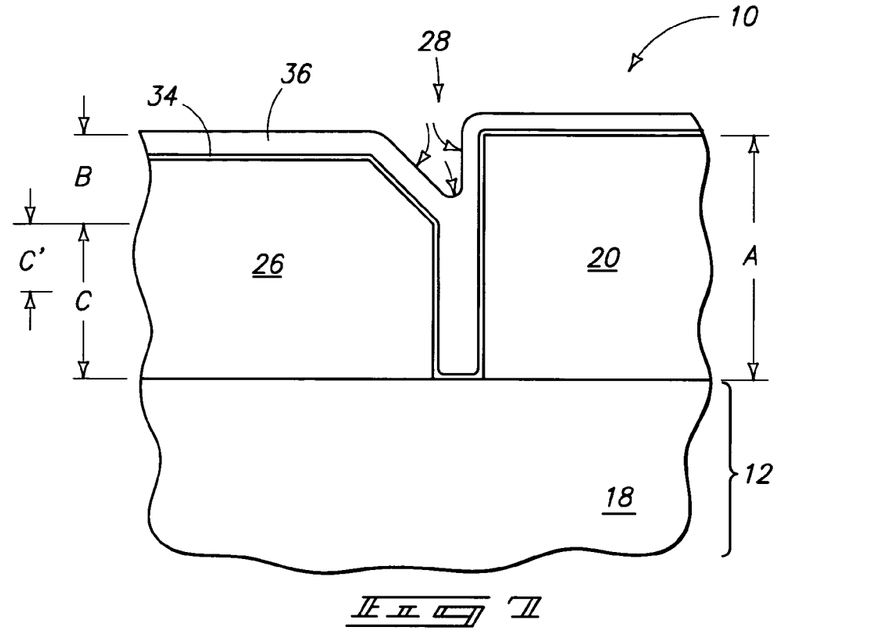
FIG. 7 is a view of the FIG. 6 substrate fragment at a processing step subsequent to that depicted by FIG. 6.

Referring to FIG. 7, a gate dielectric material 34 and a conductive gate material 36 have been formed within space 28. Gate dielectric material 34 and conductive gate material 36, in combination, fill adjacent portion C/C' of space 28, but do not fill outermost portion B of space 28. An exemplary preferred gate dielectric material comprises silicon dioxide, with exemplary preferred conductive gate materials being polysilicon, titanium nitride and tantalum nitride.

Figure 8:
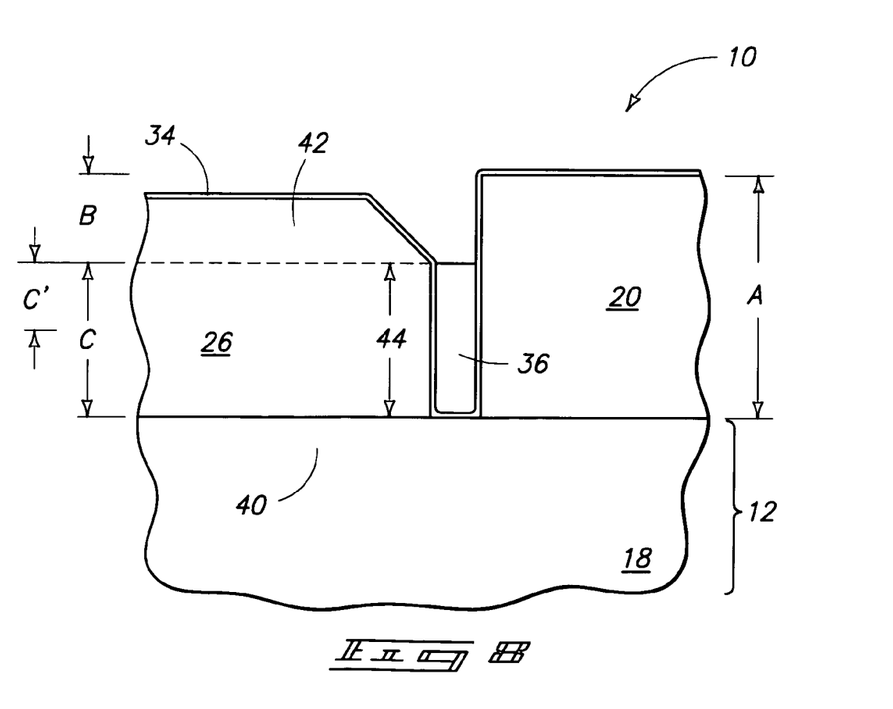
FIG. 8 is a view of the FIG. 7 substrate fragment at a processing step subsequent to that depicted by FIG. 7.

Referring to FIG. 8, at least some of conductive gate material 36 is etched from at least a majority of outermost portion B of space 28. In the depicted preferred embodiment, such etching etches all of conductive gate material 36 from outermost portion B of space 28. In one most preferred embodiment, the etching of conductive gate material 36 is isotropic. By way of example only, an exemplary isotropic plasma etching chemistry for polysilicon comprises a combination of $NF_3$, $SF_6$ and He or Ar. Further by way of example only, an exemplary plasma etching chemistry for TiN includes $Cl_2$ with about 15 weight percent $CF_4$. Further by way of example only, an exemplary etching chemistry for tantalum nitride comprises a mixture of $Cl_2$, $O_2$ and $CF_4$.

A continuing goal in field effect transistor fabrication is to precisely control the length of the channel between the source/drain regions, which is essentially defined by the gate width. In the exemplary preferred embodiment, this will be the height of the grown/deposited semiconductive material 26 in combination with the height/thickness of conductive gate material 36 formed thereover in space 28. A previous, non-inventive, method would produce the structure of FIG. 5, and fill the depicted space with gate dielectric and conductive gate material. Some sort of anisotropic or isotropic etch would then be conducted, with the goal being to precisely stop that etch near or at the upper surface of the grown epitaxial silicon, or to controllably have the conductive gate material etched back to below the upper surface of the epitaxially grown silicon to some controlled point. Regardless, control of such etch was difficult, lacking any controllable point to stop the etch, with the etching of the gate layer being largely controlled only by the timing of the etch. Further, the more etching required, the more difficult it is to control such timing. By way of example only in the depicted FIG. 7 embodiment, less than complete filling of an upper portion of the space enabled by a widened outer portion of that space results in less conductive gate material thickness in a vertical direction needing to be removed. Further, if the nature of the preferred etch is isotropic, etching attack on the conductive gate occurs along multiple sides of material 36, as depicted by the arrows in FIG. 7, as opposed to essentially largely or only from a single top surface as would occur in a prior method of the etch as described above. These two factors can enable or at least improve causing the end point for the conductive gate etch to stop in a more controlled manner, and further preferably controlled to stop at the corner where the widened portion of the space meets the depicted narrower portion of the space, although the invention in its broadest sense is not so limited. Yet with less than fully depleted transistor structures, such are less sensitive to channel length/gate width variation.

Further, the height A may vary or be hard to control due to CMP and other process variations. However since the height of the gate is essentially or largely tied to height C regardless of A and B, there will likely be better reproducibility and control of the gate dimension in the vertical dimension.

To provide an interconnect, or a simple means of contacting the gate material, one can form a patterning layer (not shown) after formation of gate conductor 36 but before the exemplary FIG. 8 etching of conductor 36. Such can be used to form generally horizontally oriented regions of conductive material. For example and by way of example only, such might be used to make contacts to, or to form local interconnects.

Figure 9:
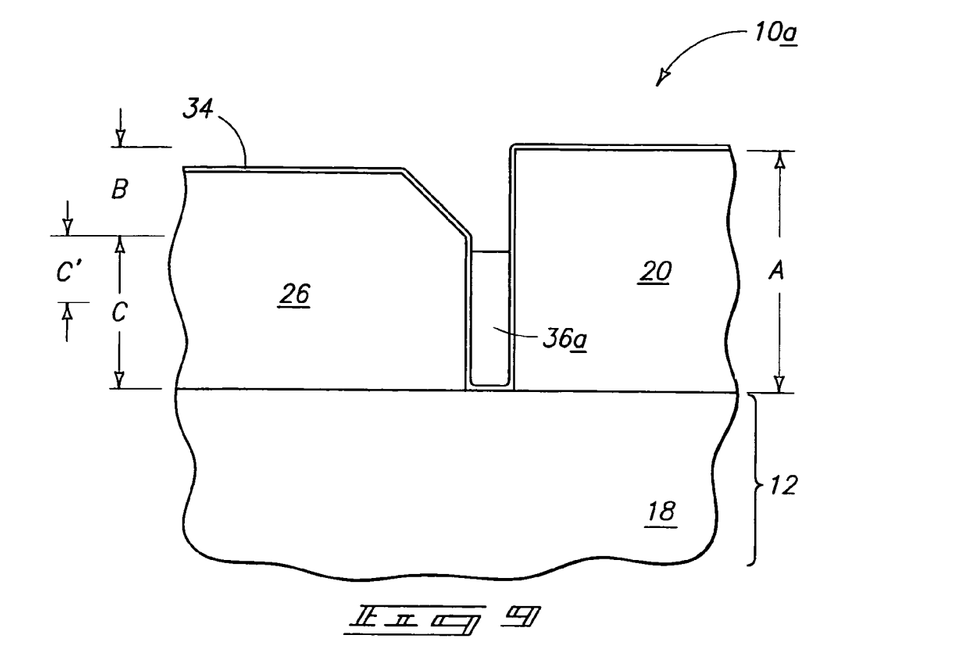
FIG. 9 is a diagrammatic sectional view of another substrate fragment in process in accordance with an aspect of the invention.

In one preferred embodiment, the conductive gate material etching etches none of the conductive gate material from adjacent portion C, for example as depicted in FIG. 8. Further of course, not all of material 36 need be removed from space portion B, but such is preferred. Regardless, an alternate exemplary embodiment substrate fragment 10a is depicted in FIG. 9. Like numerals form the first described embodiment have been utilized where appropriate, with differences being indicated with the suffix "a". FIG. 9 depicts some of material 36 from adjacent portion C of space 28 having been etched, leaving material 36a.

Figure 10:
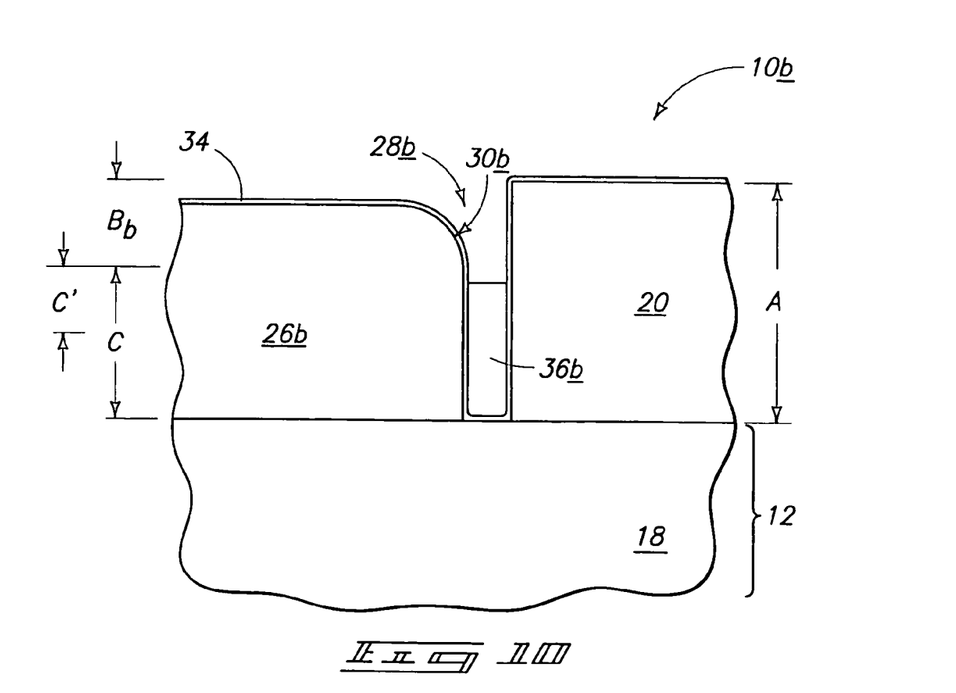
FIG. 10 is a diagrammatic sectional view of another substrate fragment in process in accordance with an aspect of the invention.
Figure 11:
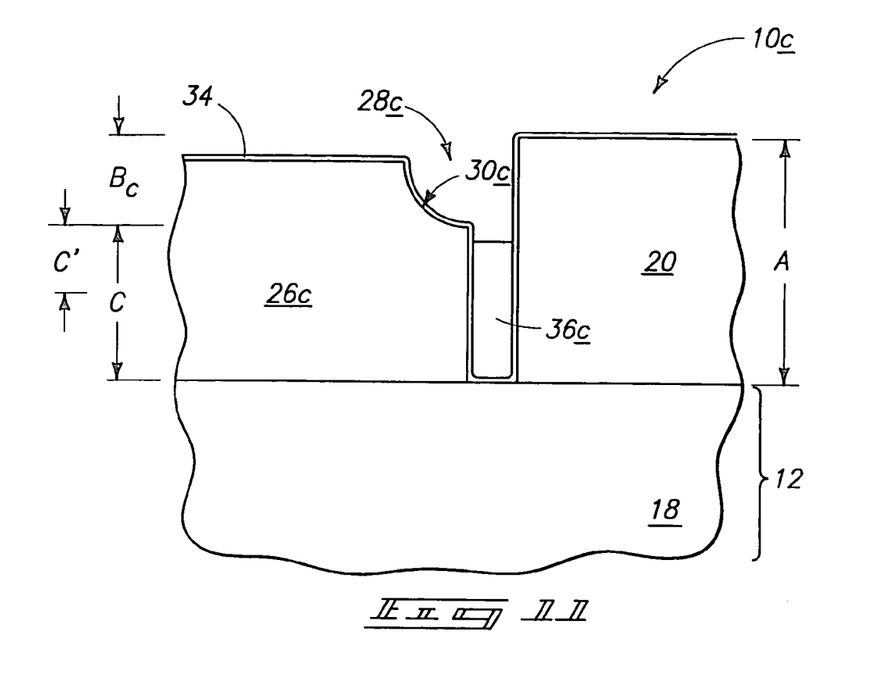
FIG. 11 is a diagrammatic sectional view of another substrate fragment in process in accordance with an aspect of the invention.

FIGS. 10 and 11 illustrate alternate exemplary embodiment substrate fragments 10b and 10c, respectively. Like numerals form the first described embodiments have been utilized where appropriate, with differences being indicated with the suffix "b" and the suffix "c", respectively. FIGS. 10 and 11 depict semiconductive material 26b, 26c, respectively, comprising curved surfaces 30b, 30c, respectively, extending along at least some of the depicted outermost portions Bb, Bc of spaces 28b, 28c, respectively. In the depicted examples, curved surface 30b is convex, and curved surface 30c is concave. By way of example only, the profiles in FIGS. 10 and 11 can be created using $Cl_2$ based dry plasma etching, particularly where sacrificial materials 26b and 26c comprise epitaxially grown silicon, and with higher powers during epitaxial growth tending toward convex profiles during the subsequent etch and with lower powers during epitaxial growth tending toward concave profiles during the subsequent etch.

Source/drain regions are ultimately formed operatively proximate the conductive gate material, and the semiconductive material is used as a channel region of the field effect transistor which has been fabricated. By way of example only, such is depicted and described with reference to FIG. 8. For example, a region 40 of material 18 can be fabricated to constitute at least a portion of one source/drain region of the field effect transistor. Further by way of example only, an upper region 42 of semiconductive material 26 can be fabricated or otherwise conductively doped to comprise at least a portion of an opposing source/drain region of the field effect transistor. In such example, semiconductive material 26 received along line 44 is used as a channel region which is gated by conductive gate material 36 for imparting current flow between source/drain regions 40, 42 through material 26 spanning 44. Further in such described example, at least some of semiconductive material 26 is thus formed to comprise at least some of at least one of the source/drain regions, for example source/drain region 42.

Figure 12:
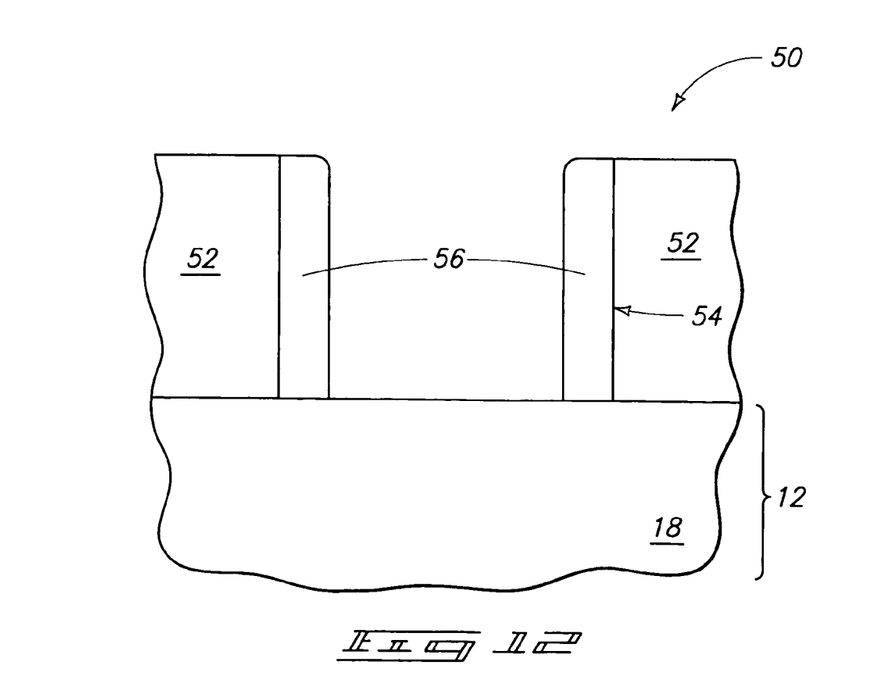
FIG. 12 is a diagrammatic sectional view of another substrate fragment in process in accordance with an aspect of the invention.

By way of example only, an additional preferred method of forming a field effect transistor is described with reference to FIGS. 12-16. Like numerals form the first described embodiment have been utilized where appropriate, with differences being indicated with different numerals. FIG. 12 depicts a substrate fragment 50 comprising a semiconductor substrate 12. An insulative layer 52 has been formed over semiconductor substrate 12. Preferred attributes of layer 52 are the same as that described above with respect to mass of material 20. An opening 54 has been formed within insulative layer 52. In one preferred embodiment, opening 54 extends to material 18, with a preferred outer surface of material 18 thereof comprising silicon-comprising material. A sacrificial material has been deposited and anisotropically etched to produce spacers 56. Attributes of spacers 56 are preferably as described above with respect to spacer material 24.

Figure 13:
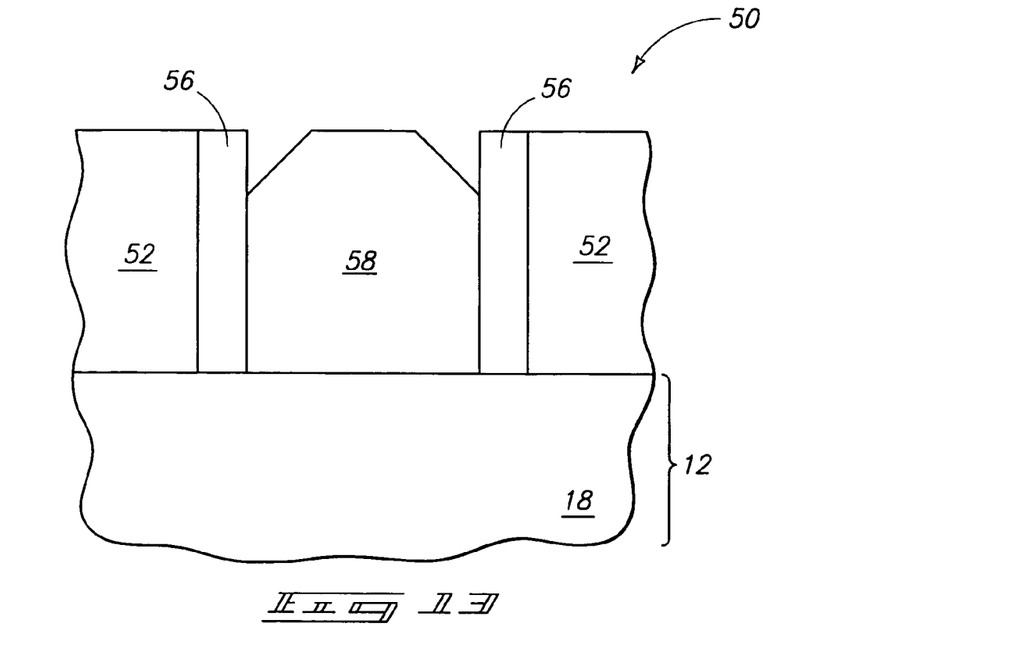
FIG. 13 is a view of the FIG. 12 substrate fragment at a processing step subsequent to that depicted by FIG. 12.

Referring to FIG. 13, silicon comprising material 58 has been epitaxially grown outwardly from the silicon comprising material 18 within opening 54, and laterally spaced from insulative layer 52 within opening 54. In the depicted embodiment, epitaxially grown silicon 58 is shown as having faceted outermost corner regions which could be the result of deposition techniques as described above, or etching subsequent to the formation of material 58.

Figure 14:
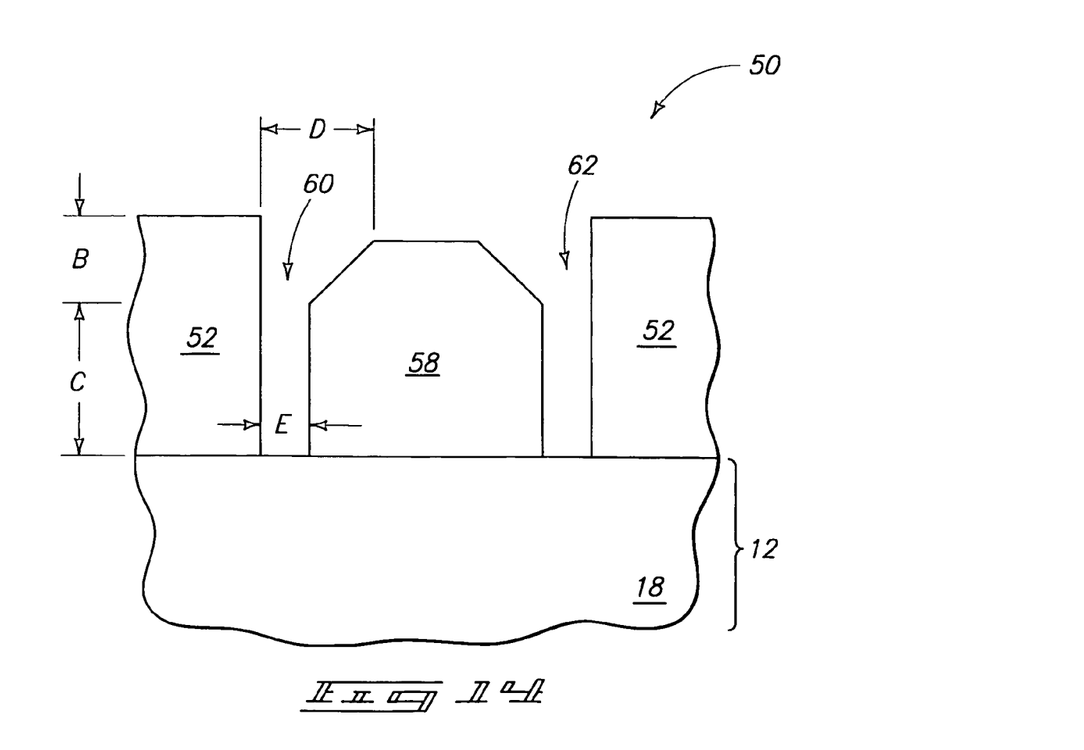
FIG. 14 is a view of the FIG. 13 substrate fragment at a processing step subsequent to that depicted by FIG. 13.

Referring to FIG. 14, material 56 has been removed from the substrate. Such provides but one example of providing opposing spaces 60, 62 laterally between insulative layer 52 and epitaxially grown silicon 58. Opposing spaces 60, 62 comprise respective outermost portions B and respective portions C immediately adjacent thereto, wherein outermost portions B have respective maximum lateral widths D which are greater than respective maximum lateral widths E of the respective adjacent portions C. Preferred attributes are otherwise as described above in connection with the first described embodiment.

Figure 15:
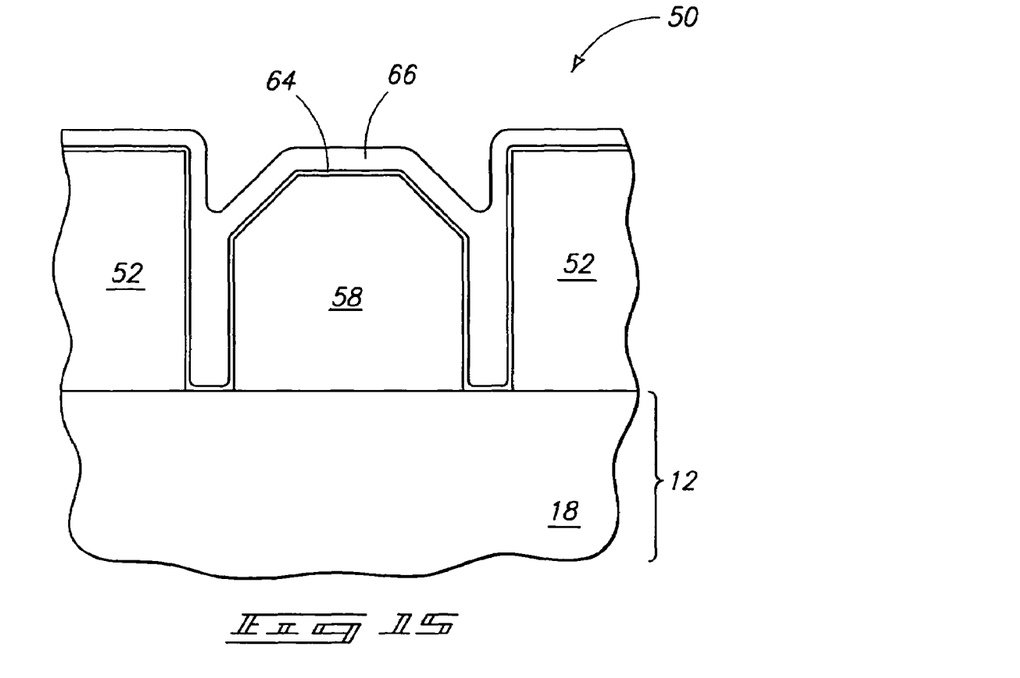
FIG. 15 is a view of the FIG. 14 substrate fragment at a processing step subsequent to that depicted by FIG. 14.

Referring to FIG. 15, a gate dielectric material 64 and a conductive gate material 66 have been formed within opposing spaces 60, 62. Gate dielectric material 64 and conductive gate material 66, in combination, fill the respective adjacent portions C of opposing spaces 60, 62, but do not fill the respective outermost portions B of opposing spaces 60, 62. Preferred attributes are otherwise as described above with respect to materials 34 and 36 of the first described embodiment.

Figure 16:
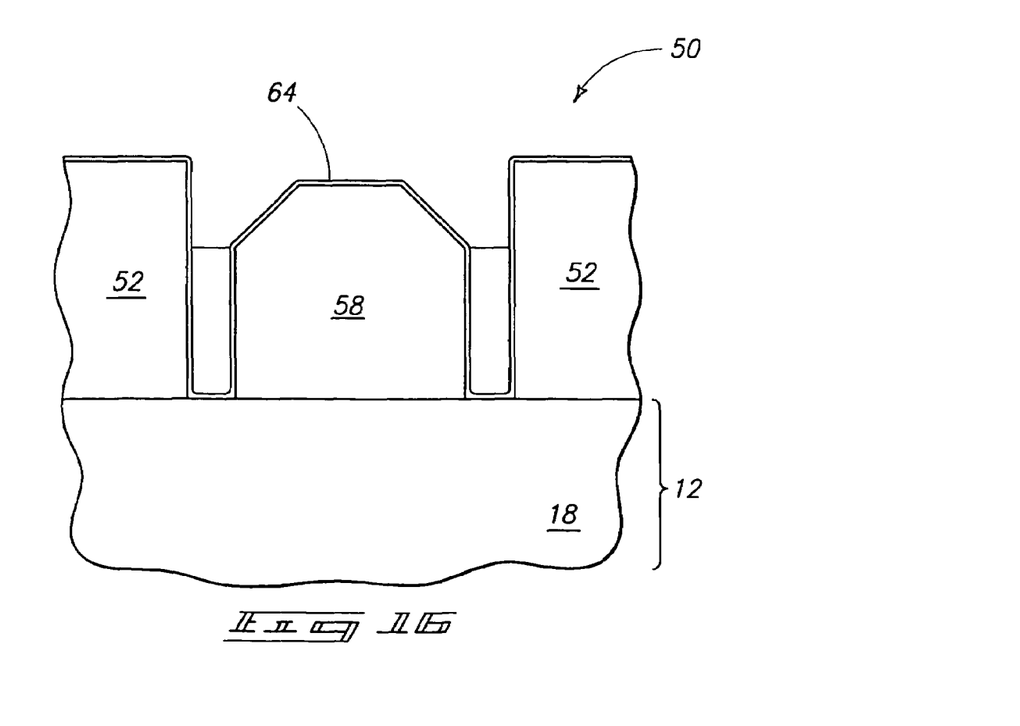
FIG. 16 is a view of the FIG. 15 substrate fragment at a processing step subsequent to that depicted by FIG. 15.

Referring to FIG. 16, at least conductive gate material 66 is etched from at least a majority of the respective outermost portions B of opposing spaces 60, 62, for example as described above in connection with the FIGS. 8 and 9 embodiments. Preferred attributes are otherwise as described above. Source/drain regions are ultimately formed operatively proximate conductive gate material 66 and using epitaxially grown silicon comprising material 58 as a channel region of the field effect transistor. Preferred attributes are otherwise as described above in connection with the FIGS. 1-11 embodiments.

In one exemplary embodiment, a method of forming a field effect transistor comprises forming an insulative layer over a semiconductor substrate, with the insulative layer comprising an opening therein (i.e., by deposition and subsequent patterning thereof). Semiconductive material is formed within the opening and laterally spaced from the insulative layer within the opening. The semiconductive material is provided to have faceted outermost corner regions which are spaced from the insulative layer. By way of example only, FIG. 14 depicts such a substrate so provided.

Conductive gate material is formed over the faceted corner regions regardless of whether completely or partially filling an outer portion of the space defined in part by such faceted corner regions. Such conductive gate material is then etched from over at least a majority of the faceted corner regions. Source/drain regions are formed operatively proximate the conductive gate material, and the semiconductive material is used as a channel region of the field effect transistor that is formed. Preferred attributes are otherwise as described above and claimed herein.

Aspects of the invention might be used to fabricate $4F^2$ area encompassing field effect transistors. Further, advantages might exist in improving contact area and alignment tolerances in aspects of the invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a field effect transistor, comprising:
    forming a mass of material over a semiconductor substrate;
    forming semiconductive material laterally proximate and spaced from the mass of material, the semiconductive material comprising a corner proximate the mass of material;
    removing semiconductive material of the corner and forming a space laterally between the mass of material and the semiconductive material having an outermost portion and a portion immediately adjacent thereto with the outermost portion having a maximum lateral width which is greater than that of the adjacent portion;
    forming gate dielectric material and conductive gate material within the space, the gate dielectric material and the conductive gate material in combination filling the adjacent portion of the space but not filling the outermost portion of the space;
    etching at least the conductive gate material from at least a majority of the outermost portion of the space; and
    forming source/drain regions operatively proximate the conductive gate material and using the semiconductive material as a channel region of the field effect transistor.

2. The method of claim 1 wherein the removing comprises masked angled physical ion bombardment.

3. The method of claim 1 wherein the removing comprises maskless angled physical ion bombardment.

4. The method of claim 1 wherein the removing comprises masked dry etchback.

5. The method of claim 1 wherein the removing comprises maskless dry etchback.

6. The method of claim 1 wherein the removing comprises masked potassium hydroxide wet etching.

7. The method of claim 1 wherein the removing comprises maskless potassium hydroxide wet etching.

8. The method of claim 1 wherein at least a majority of the mass of material received over the semiconductor substrate remains as part of finished circuitry construction encompassing the field effect transistor.

9. The method of claim 1 wherein at least that portion of the mass of material received over the semiconductor substrate which is adjacent the space is insulative.

10. The method of claim 1 wherein the semiconductive material comprises a planar surface extending along at least some of the outermost portion of the space.

11. The method of claim 1 wherein the outermost portion of the space has variable width.

12. The method of claim 1 wherein the etching etches none of the conductive gate material from the adjacent portion of the space.

13. The method of claim 1 wherein the etching etches all of the conductive gate material from the outermost portion of the space.

14. The method of claim 1 wherein at least some of the semiconductive material is formed to comprise at least some of at least one of the source/drain regions.

15. The method of claim 1 wherein the outermost portion of the space has a height of at least 50 Angstroms.

16. The method of claim 15 wherein the outermost portion of the space has a height no greater than 400 Angstroms.

17. A method of forming a field effect transistor, comprising:
forming a mass of material over a semiconductor substrate;
forming semiconductive material laterally proximate and spaced from the mass of material, the semiconductive material comprising a corner proximate the mass of material, the mass of material and the semiconductive material being formed to comprise coplanar elevationally outermost surfaces;
removing semiconductive material of the corner and forming a space laterally between the mass of material and the semiconductive material having an outermost portion and a portion immediately adjacent thereto with the outermost portion having a maximum lateral width which is greater than that of the adjacent portion, the removing forming the elevationally outermost surface of the semiconductive material to not be coplanar with that of the mass of material;
forming gate dielectric material and conductive gate material within the space, the gate dielectric material and the conductive gate material in combination filling the adjacent portion of the space but not filling the outermost portion of the space;
etching at least the conductive gate material from at least a majority of the outermost portion of the space; and
forming source/drain regions operatively proximate the conductive gate material and using the semiconductive material as a channel region of the field effect transistor.

18. The method of claim 17 wherein the outermost portion of the space has a height no greater than 400 Angstroms.

19. A method of forming a field effect transistor, comprising:
forming a mass of material over a semiconductor substrate;
forming semiconductive material laterally proximate and spaced from the mass of material, the semiconductive material comprising a corner proximate the mass of material;
removing semiconductive material of the corner and forming a space laterally between the mass of material and the semiconductive material having an outermost portion and a portion immediately adjacent thereto with the outermost portion having a maximum lateral width which is greater than that of the adjacent portion, the mass of material having a thickness over the semiconductor substrate, the space extending along all of said thickness;
forming gate dielectric material and conductive gate material within the space, the gate dielectric material and the conductive gate material in combination filling the adjacent portion of the space but not filling the outermost portion of the space;
etching at least the conductive gate material from at least a majority of the outermost portion of the space; and
forming source/drain regions operatively proximate the conductive gate material and using the semiconductive material as a channel region of the field effect transistor.

20. A method of forming a field effect transistor, comprising:
forming a mass of material over a semiconductor substrate;
forming semiconductive material laterally proximate and spaced from the mass of material, the semiconductive material comprising a corner proximate the mass of material;
removing semiconductive material of the corner and forming a space laterally between the mass of material and the semiconductive material having an outermost portion and a portion immediately adjacent thereto with the outermost portion having a maximum lateral width which is greater than that of the adjacent portion, the mass of material having a thickness over the semiconductor substrate, the space extending along less than all of said thickness;
forming gate dielectric material and conductive gate material within the space, the gate dielectric material and the conductive gate material in combination filling the adjacent portion of the space but not filling the outermost portion of the space;
etching at least the conductive gate material from at least a majority of the outermost portion of the space; and
forming source/drain regions operatively proximate the conductive gate material and using the semiconductive material as a channel region of the field effect transistor.

21. A method of forming a field effect transistor, comprising:
forming a mass of material over a semiconductor substrate;
forming semiconductive material laterally proximate and spaced from the mass of material, the semiconductive material comprising a corner proximate the mass of material;
removing semiconductive material of the corner and forming a space laterally between the mass of material and the semiconductive material having an outermost portion and a portion immediately adjacent thereto with the outermost portion having a maximum lateral width which is greater than that of the adjacent portion, the semiconductive material comprising a curved surface extending along at least some of the outermost portion of the space;
forming gate dielectric material and conductive gate material within the space, the gate dielectric material and the conductive gate material in combination filling the adjacent portion of the space but not filling the outermost portion of the space;

etching at least the conductive gate material from at least a majority of the outermost portion of the space; and forming source/drain regions operatively proximate the conductive gate material and using the semiconductive material as a channel region of the field effect transistor.

22. The method of claim 21 wherein the curved surface is convex.

23. The method of claim 21 wherein the curved surface is concave.

24. The method of claim 21 wherein the etching etches none of the conductive gate material from the adjacent portion of the space.

25. The method of claim 21 wherein the etching etches all of the conductive gate material from the outermost portion of the space.

* * * * *

UNITED STATES PATENT AND TRADEMARK OFFICE
CERTIFICATE OF CORRECTION

| | |
|---|---|
| PATENT NO. | : 7,557,006 B2 |
| APPLICATION NO. | : 11/490681 |
| DATED | : July 7, 2009 |
| INVENTOR(S) | : Gurtej S. Sandhu et al. |

It is certified that error appears in the above-identified patent and that said Letters Patent is hereby corrected as shown below:

In column 1, line 10, delete "Cern" and insert -- Cem --, therefor.

Signed and Sealed this

Twenty-fifth Day of August, 2009

David J. Kappos
*Director of the United States Patent and Trademark Office*